(12) United States Patent
Sridharan et al.

(10) Patent No.: US 6,694,476 B1
(45) Date of Patent: Feb. 17, 2004

(54) REED-SOLOMON ENCODER AND DECODER

(75) Inventors: Satish Sridharan, West Hills, CA (US); Michael Jarchi, Northridge, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 253 days.

(21) Appl. No.: 09/586,524

(22) Filed: Jun. 2, 2000

(51) Int. Cl.$^7$ .............................................. H03M 13/00
(52) U.S. Cl. ...................................................... 714/781
(58) Field of Search ................................ 714/781, 784, 714/785

(56) References Cited

U.S. PATENT DOCUMENTS

| | | | | |
|---|---|---|---|---|
| 3,893,078 A | * | 7/1975 | Finet ........................... | 714/759 |
| 4,059,825 A | * | 11/1977 | Greene ........................ | 714/762 |
| 4,077,028 A | | 2/1978 | Lui et al. ................... | 340/146.1 |
| 4,099,160 A | | 7/1978 | Flagg ......................... | 340/146.1 |
| 4,142,174 A | | 2/1979 | Chen et al. ............... | 340/146.1 |
| 4,162,480 A | | 7/1979 | Berlekamp ................ | 340/146.1 |
| 4,410,989 A | | 10/1983 | Berlekamp ................ | 371/40 |
| 4,413,340 A | | 11/1983 | Odaka et al. .................. | 371/39 |
| 4,494,234 A | | 1/1985 | Patel ............................ | 371/38 |
| 4,504,948 A | | 3/1985 | Patel ............................ | 371/38 |
| 4,587,627 A | | 5/1986 | Omura et al. ................ | 364/754 |
| 4,633,470 A | * | 12/1986 | Welch et al. ................ | 714/781 |
| 4,633,471 A | | 12/1986 | Perera et al. ................ | 371/38 |
| 4,718,067 A | | 1/1988 | Peters ......................... | 371/38 |
| 4,763,330 A | * | 8/1988 | Shimizu ...................... | 714/785 |
| 4,777,635 A | | 10/1988 | Glover ......................... | 371/40 |
| 4,835,775 A | | 5/1989 | Seroussi ...................... | 371/37 |
| 4,856,004 A | * | 8/1989 | Foster et al. ................ | 714/759 |
| 4,873,688 A | | 10/1989 | Maki et al. .................. | 371/37.1 |
| 4,937,829 A | | 6/1990 | Kadokawa ................... | 371/37.6 |
| 5,068,856 A | * | 11/1991 | Nagasawa et al. ........... | 714/756 |
| 5,140,596 A | | 8/1992 | Weldon, Jr. ................. | 371/39.1 |
| 5,170,399 A | | 12/1992 | Cameron et al. ............ | 371/37.1 |
| 5,226,043 A | | 7/1993 | Pughe, Jr. et al. ......... | 371/40.1 |
| 5,268,908 A | * | 12/1993 | Glover et al. ................ | 714/785 |
| 5,272,661 A | * | 12/1993 | Raghavan et al. .......... | 708/492 |
| 5,315,600 A | * | 5/1994 | Iwamura et al. ............ | 714/757 |
| 5,323,402 A | | 6/1994 | Vaccaro et al. ............. | 371/37.1 |
| 5,375,127 A | | 12/1994 | Leak et al. ................. | 371/40.1 |
| 5,384,786 A | | 1/1995 | Dudley et al. .............. | 371/37.1 |
| 5,440,570 A | * | 8/1995 | Wei et al. .................... | 714/782 |
| 5,446,743 A | * | 8/1995 | Zook ........................... | 714/784 |
| 5,512,853 A | | 4/1996 | Ueno et al. ................. | 371/37.1 |

(List continued on next page.)

FOREIGN PATENT DOCUMENTS

WO       PCT/ISA/220       10/2000

OTHER PUBLICATIONS

Stephen B. Wicker, Error Control Systems for Digital Communication and Storage, Prentice–Hall, 1995, pp. 80–85 and 206–211.*

(List continued on next page.)

*Primary Examiner*—Albert Decady
*Assistant Examiner*—Joseph D. Torres
(74) *Attorney, Agent, or Firm*—Christie, Parker & Hale, LLP (57) ABSTRACT

A semi-parallel forward error correction system. In one embodiment the forward error correction system includes a semi-parallel Reed-Solomon encoder and a semi-parallel Reed-Solomon decoder. Information symbols comprised of bytes are provided eight bytes in parallel to an encoder which in parallel forms eight bytes of a nonsystematic code word. On decoding, a code word is provided to a time multiplexed syndrome generator and key equation solver. An error locator polynomial from the key equation solver and the syndromes from the syndrome generator are provided to an error location and error magnitude unit, which includes a plurality of polynomial evaluator units which process an error locator polynomial in parallel.

5 Claims, 7 Drawing Sheets

U.S. PATENT DOCUMENTS

| | | | | |
|---|---|---|---|---|
| 5,666,369 | A | | 9/1997 | Nakamura ................ 371/37.07 |
| 5,689,452 | A | | 11/1997 | Cameron ................ 364/746.1 |
| 5,691,997 | A | * | 11/1997 | Lackey, Jr. ................ 714/807 |
| 5,699,368 | A | | 12/1997 | Sakai et al. ................ 371/37.1 |
| 5,754,563 | A | * | 5/1998 | White ........................ 714/757 |
| 5,757,826 | A | | 5/1998 | Fredrickson ............. 371/37.11 |
| 5,805,617 | A | * | 9/1998 | Im ............................ 714/785 |
| 5,878,058 | A | | 3/1999 | Im ............................ 371/37.11 |
| 5,974,580 | A | | 10/1999 | Zook et al. ................. 714/755 |
| 6,023,782 | A | | 2/2000 | Cox et al. ................... 714/784 |
| 6,031,875 | A | * | 2/2000 | Im ............................ 375/262 |
| 6,038,694 | A | * | 3/2000 | Swallow ..................... 714/781 |
| 6,192,499 | B1 | * | 2/2001 | Yang .......................... 714/785 |
| 6,209,115 | B1 | * | 3/2001 | Truong et al. ............. 714/784 |
| 6,308,295 | B1 | * | 10/2001 | Sridharan et al. ........... 714/755 |
| 6,374,383 | B1 | * | 4/2002 | Weng ........................ 714/781 |
| 6,493,845 | B1 | * | 12/2002 | Shen et al. ................. 714/784 |

OTHER PUBLICATIONS

Stephen Wicker, Error Control Systems for Digital Communication and Storage, Prentice–hall, 1995, paes 116–121.*

Wang, et al., "VLSI Architectures for Computing Multiplications and Inverses in GF($2^m$)," IEEE Transaction on Computers, Vol C–34, No. 8, pp. 709–717, Aug. 1985.

Shao, et al., "A VLSI Design of a Pipeline Reed–Solomon Decoder," IEEE Transaction on Computers, Vol C–34, No. 5, pp. 393–403, Aug. 1985.

Eastman, "Euclideanization of the Berlekamp–Massey Algorithm" from the Proceedings of the 1988 Tactical Communications Conference, Vol 1 (1988), pp. 295–303.

Choomchuay, Arambepola, "Reed–Solomon Decoding," IEEE Proceedings–1, Vol 140, No. 3, Jun. 1993.

Manuscript: Neifeld, Hayes, "Optical and Electronic Error Correction Schemes for Highly Parallel Access Memories," Proceedings of the SPIE—The International Society for Optical Engineering vol. 2026 (1993) p543–53.

Thesis: Sridharan, "VLSI Implementation of a Spectral Domain Parallel Error Decoder," University of Arizona, 1995.

Neifeld, Hayesm, "Error–Correction Schemes for Volume Optical Memories," Applied Optics, Vol 34, No. 35 pp. 8183–8191, Dec. 1995.

Internet Papers: Matache, "Berlekamp's Iterative Algorithm for Finding the Eror–Locator Polynomial," http://drake.ee-.washington.edu/~adina/rsc/slide/node8.html.

Internet Papers: BAD, "Overview of Forward Error Correction," http://ee.wpi.edu/courses/ee535/hwk97/hwk4cd97/bad/paper.html, pp. 1–14.

Conference Paper: "Practical Reed Solomon Design for PLD Architectures" Altera Corporation; http://www.altera-.com/html/literature/lconf.html.

* cited by examiner

REED-SOLOMON ENCODER AND DECODER

BACKGROUND OF THE INVENTION

The present invention relates generally to systems and methods for performing Reed-Solomon encoding and decoding, and in particular to semi-parallel Reed-Solomon encoders and decoders.

The transmission of information is of great importance to computing networks, from a local area network to the Internet. In thriving computing networks, the demands for a faster, more reliable and cost-effective manner of transmitting information are constantly increasing. However, satisfying these demands is difficult and replete with obstacles. These obstacles include bandwidth limitations, total system component costs, reliability and quality of service.

Conventional fiber optic networks, generally conforming to standards such as synchronous optical network (SONET) and synchronous digital hierarchy (SDH), are widely prevalent and allow for increasingly greater transmission. Also, with the advent of time division multiplexing (TDM) components, the conventional fiber optic bandwidth is quadrupled. However, as new technologies and services develop in video, high resolution graphics and other types of applications requiring tremendous amounts of data, the bandwidth provided by TDM is being quickly exhausted.

Also, as the demand for faster service and the dependence of computing networks on the transmission of information grows, the reliability on the information becomes critical. Multiple types of transmission schemes have been developed to ensure data trustworthiness. One common and widely utilized transmission scheme, especially in the high-speed realm of fiber optics, is Reed-Solomon (RS) encoding and decoding. However, serial operation of RS encoding and decoding acts, to an extent, as a bottleneck in data transmission systems that use high data rates. On the other hand, fully parallel operation of RS encoding and decoding provides better time performance under high data rates, but is often costly and complex, and includes high VLSI gate counts and increased power usage requirements.

SUMMARY OF THE INVENTION

The present invention provides a semi-parallel Reed-Solomon encoder and decoder. In one embodiment, the present invention comprises a method of performing semi-parallel encoding and decoding using an (n,k) code. In one embodiment the method comprises sequentially providing sets of a plurality of information symbols to an encoder, the sets of the plurality of information symbols forming an information word. On each set of the information symbols Galois field multiplication is sequentially performed to form intermediate terms. Combining the intermediate terms results in, or forms, at least some of the symbols of the code word. The method further comprises sequentially generating n−k syndromes, and determining an error locator polynomial using the n−k syndromes. Further, in one embodiment, the method comprises evaluating a plurality of roots of the error locator polynomial using a plurality of polynomial evaluators, each polynomial evaluator evaluating a plurality of the roots of the error locator polynomial.

In another embodiment, a method of the present invention comprises encoding a data stream forming an information vector, the data stream comprising a plurality of information symbols, with a method comprising providing a first set of information symbols to a Galois field multiplier, the first set of information symbols being less than the plurality of information symbols. Further, the method comprises performing Galois field multiplication on the first set of information symbols to form a first set of code words, and providing a second set of information symbols to the Galois field multiplier and performing Galois field multiplication on the second set of information symbols.

These and other aspects of the present invention are more readily understood when considered in conjunction with the accompanying drawings and the following detailed description.

DETAILED DESCRIPTION

Figure 1:
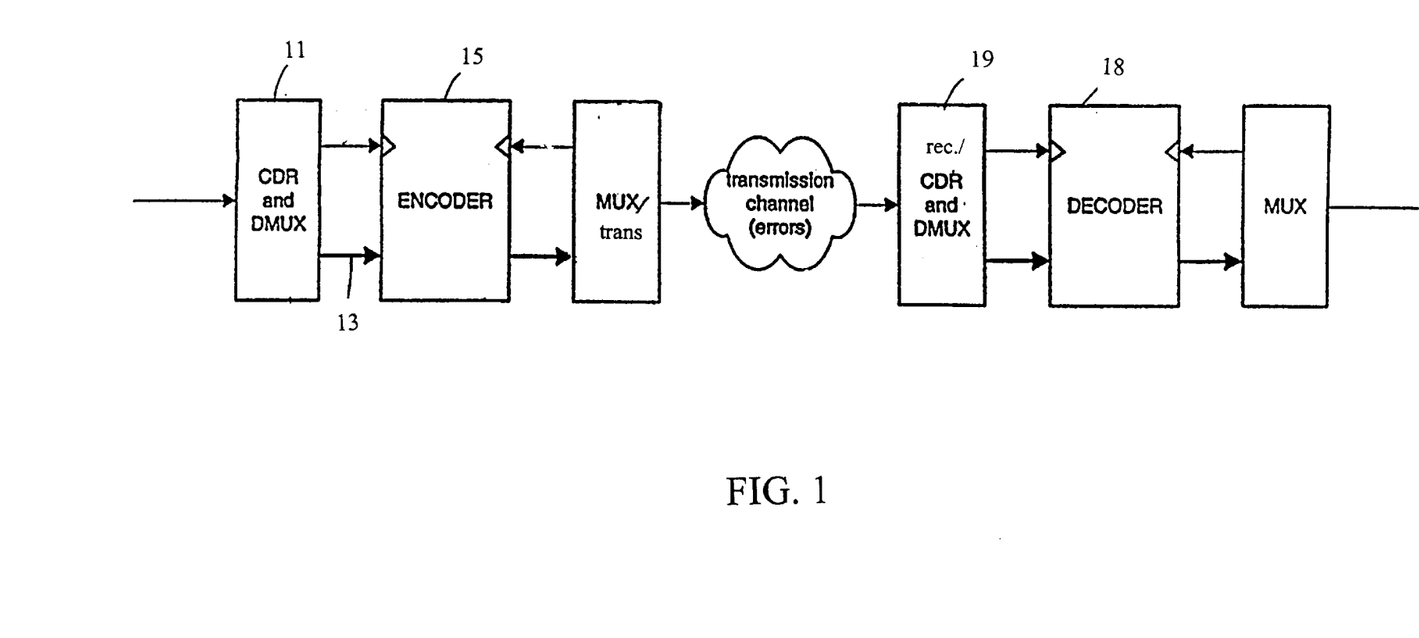
FIG. 1 illustrates a forward error correction system in accordance with the present invention.

The present invention presents a semi-parallel Reed-Solomon (RS) encoder and decoder. FIG. 1 illustrates a data transmission system in accordance with the present invention. Serial input data is provided to a clock and data recovery unit (CDR) and demultiplexer 11. The CDR and demultiplexer extracts a clock signal from the incoming data and, using the extracted clock signal, extracts the serial data. The demultiplexer forms a parallel output data stream 13 from the serial data. A clock signal based on the extracted clock signal and the parallel data stream are provided to an encoder 15. The encoder forms information words out of the parallel data stream and divides the information words by a generator polynomial to form code words.

Figure 2:
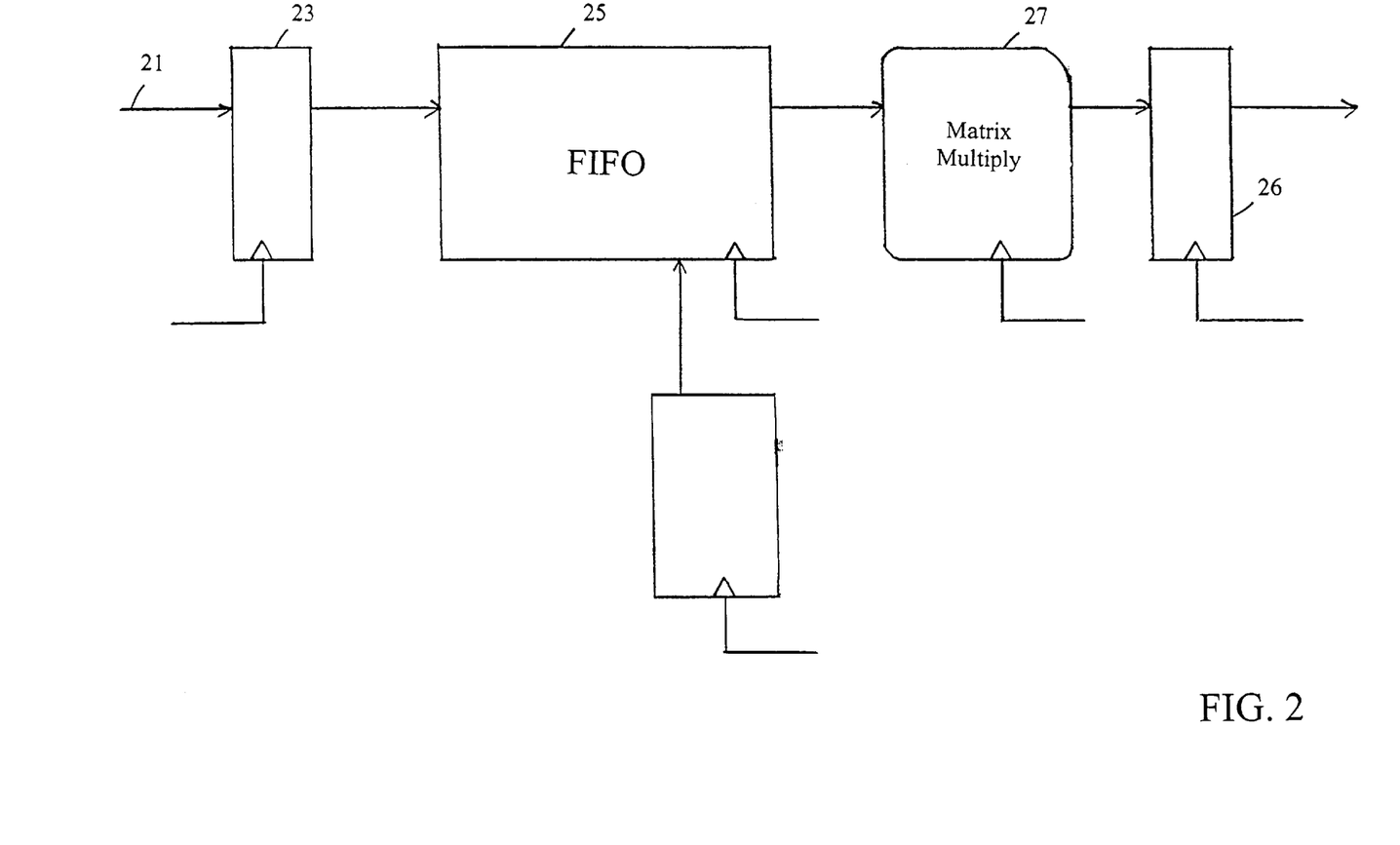
FIG. 2 illustrates an encoder in accordance with the present invention.

FIG. 2 illustrates the encoder of FIG. 1. An incoming information vector I(x) 21 is provided to a first clocked register 23. The information vector I(x) is comprised of a plurality of symbols. The plurality of symbols in the information vector I(x) is generally referred to as k, and each symbol is a data word of m bits. The first clocked register provides the information vector I(x) to an elastic FIFO 25. The FIFO may be implemented as a register stack, string buffer, or like, but is preferably implemented as a dual port parallel data buffer integrated circuit memory element. The elastic FIFO buffers the information vector, particularly during codeword transitions, as discussed below. The output of the elastic FIFO provides 8 bytes at a time to a matrix multiplier 27.

The matrix multiplier operates on the information vector in a semi-parallel fashion. The encoder, therefore, is a semi-parallel encoder. The encoder receives eight bytes per clock. In the embodiment described each symbol is one byte, so the encoder receives eight information symbols per clock. The encoder also outputs eight encoded code symbols per clock. The code symbols are provided to a second clocked register 26, which is clocked with a slightly faster clock signal than the first clocked register. This is done because the code word contains n symbols, with n=k+2t, whereas an information word contains only k symbols.

In the embodiment described the code word is a non-systematic Reed-Solomon (RS) code word. A non-systematic code word is one in which the data is transformed and redundant symbols added. By comparison, a systematic code word does not transform the data, but merely adds redundant symbols. The following discussion is generally in terms of a non-systematic code, although those of skill in the art will realize in view of the description the applicability to systematic codes.

Figure 3:
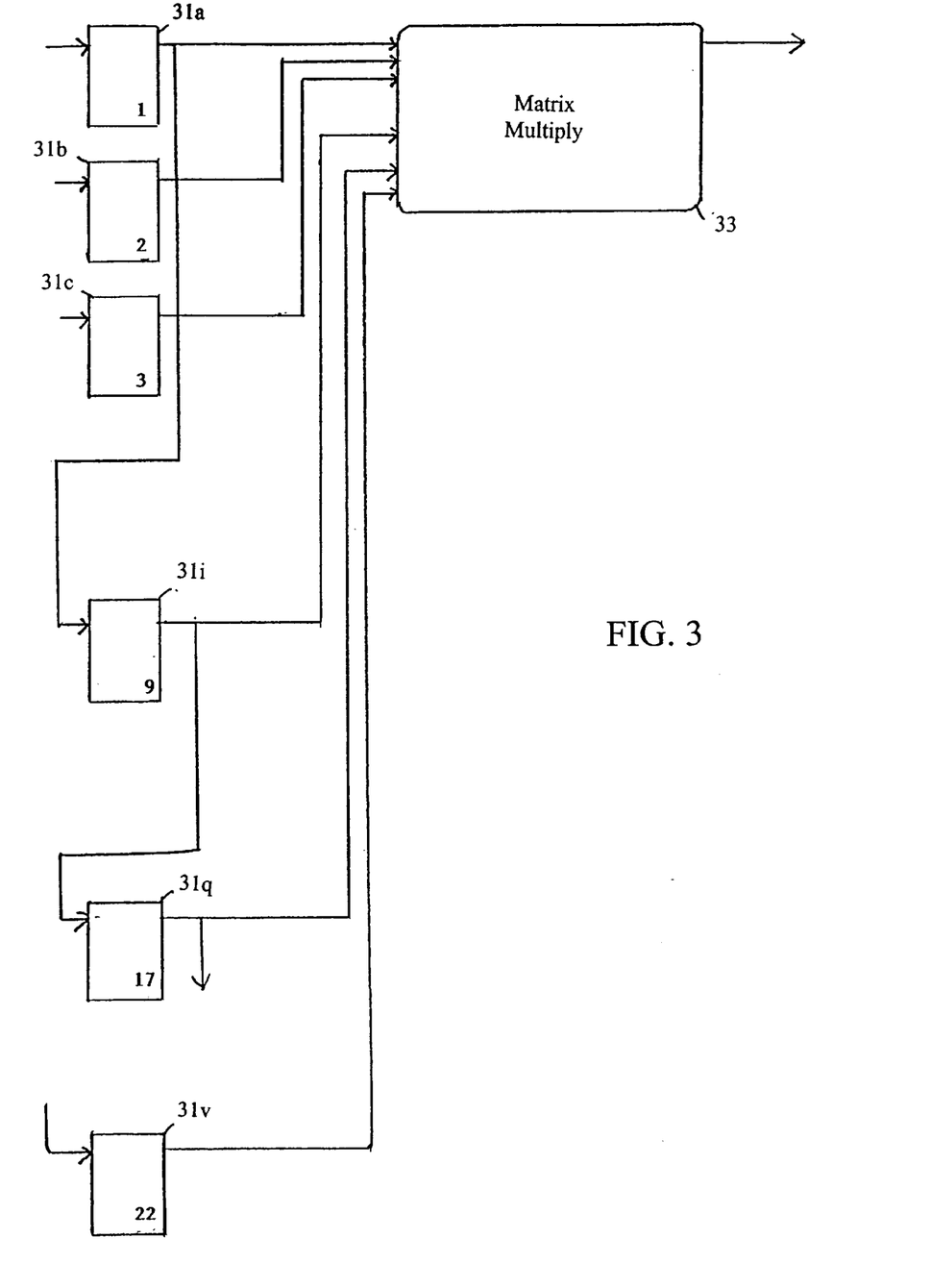
FIG. 3 illustrates a semi-parallel encoding engine in accordance with the present invention.

FIG. 3 illustrates a block diagram of the matrix multiplier for the encoder of FIG. 2. The matrix multiplier generates 8 symbols of a code word simultaneously. For a non-systematic encoding scheme, an encoder utilizes the prior 2t+1 information symbols to form one symbol of a code word. The matrix multiplier includes 22 registers 31a–v each configured to hold one symbol, which in the described embodiment is one byte. The matrix multiplier uses 22 registers in order to provide 15 prior information symbols to each of 8 matrix multipliers to form 8 symbols of code words in parallel. That is, each cycle code word symbols $C_{n-7}$–$C_n$ are generated. As the code employed is a nonsystematic (255,241) RS code generation of codeword $C_{n-7}$ requires information symbols $I_{n-7}$–$I_{n-21}$ and generation of codeword $C_n$ requires information symbols $I_n$–$I_{n-14}$.

Of the 22 registers, the first 8 registers receive incoming bytes. The remaining 14 registers receive, after shifts, the bytes in the first 8 registers. The registers are configured to shift 8 registers every clock cycle. Thus, each clock cycle the bytes in registers 9–14 are shifted to registers 17–22 (the contents of registers 15–22 are shifted entirely out). Similarly, the bytes in registers 1–8 are shifted to registers 9–16. Registers 1–8 receives incoming bytes. Accordingly, a first 8 bytes on the first clock cycle is shifted into the first 8 registers. On the next clock cycle the 8 bytes are shifted to a second set of 8 registers and a new set of 8 bytes are loaded into the first set of 8 registers. On a third clock cycle the first 2 bytes are shifted entirely out of the registers and the next 6 bytes are shifted into the final 6 registers.

Each clock cycle the contents of the registers are provided to a multiplier block 33. The multiplier block generates 8 bytes of output per clock cycle. The multiplier block performs matrix multiplication using the 22 bytes from the registers and Galois field constants stored in the multiplier block. Each byte is formed by summing the multiplication of a corresponding input byte and the previous 14 input bytes with Galois field constants to form an encoded Reed-Solomon byte of a codeword.

Bytes 242 through 255 of the code word, as well as bytes 1–14 of the code word, do not use 15 prior information bytes. For example, byte 255 of the code word depends on information byte 241, and byte 3 of the code word depends on information bytes 1, 2, and 3. Accordingly, a byte stuffer is utilized. The byte stuffer 26 is illustrated in FIG. 2, and fills the FIFO with 14 bytes of zeros after 241 information bytes are placed in the FIFO.

Returning now to FIG. 1, the encoder provides the code words to a transmitting unit 17. The transmitting unit transmits the code words over a transmission media. In the embodiment described the transmission media is a fiberoptic line and the information is transmitted serially over the fiberoptic line. After the code words are passed over the transmission media, the code words are received by a receiving unit 19. On receipt by the receiving unit the information is provided to a clock and data recovery unit and demultiplexer. The operation of the CDR and demultiplexer is as previously described with respect to the transmitting unit. Accordingly, the CDR and demultiplexer output a clock signal and a parallel input data stream. The clock signal and parallel input data stream are provided to a decoder 18.

Figure 4:
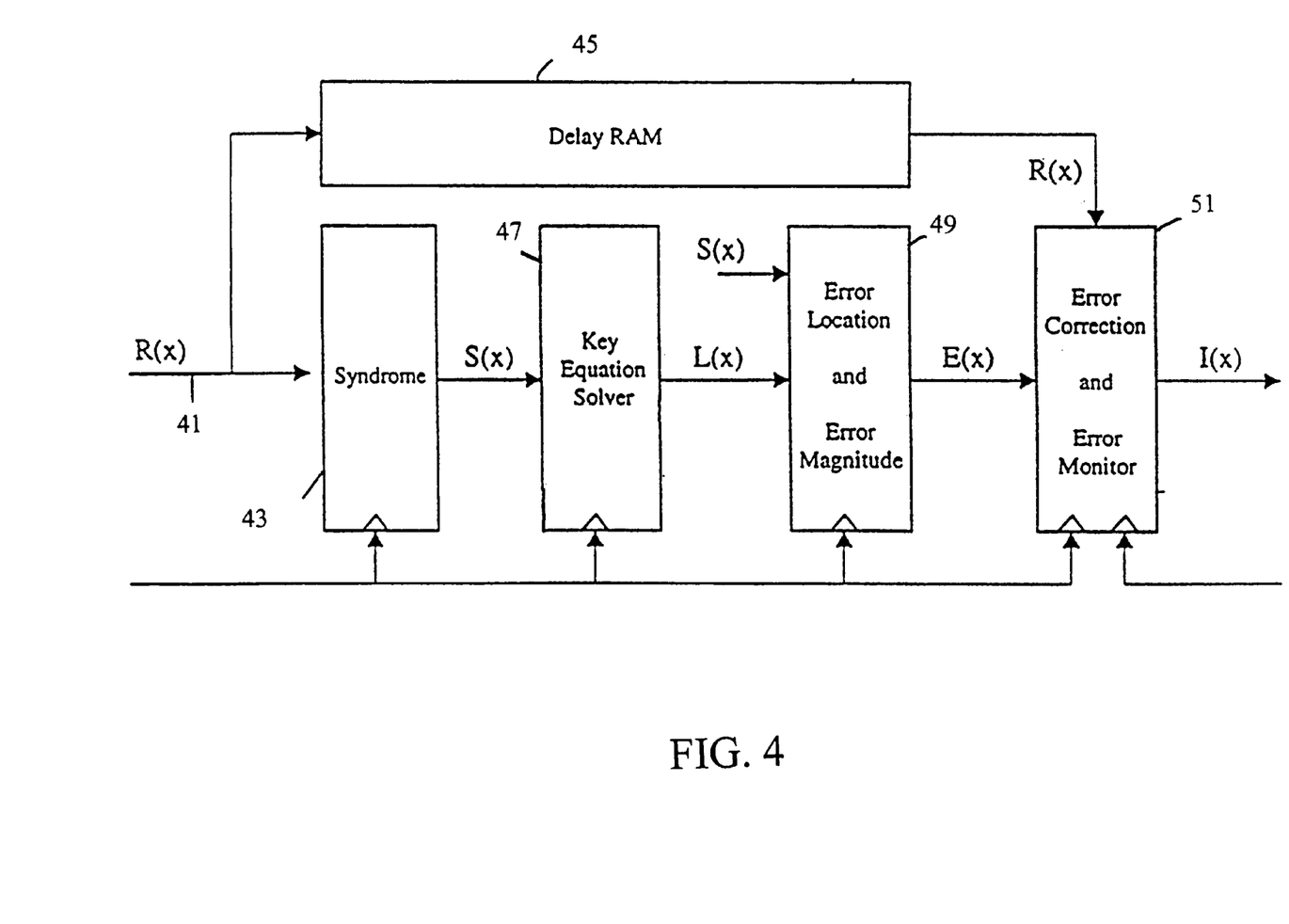
FIG. 4 illustrates a block diagram of a decoder in accordance with the present invention.

FIG. 4 illustrates a decoder in accordance with the present invention. The decoder receives a parallel input data stream 41. The parallel input data stream comprises received words, which are code words modified by error signals. The received words are provided both to a syndrome generator 43 and a delay RAM 45.

The syndrome generator generates syndrome words that are provided to a key equation solver 47 and an error location and magnitude unit 49. The key equation solver generates an error polynomial which is also provided to the error location and magnitude unit. The error location and magnitude unit generates an error vector to an error correction block 51. The error correction block also receives the received words from the delay RAM, and outputs corrected data.

Figure 5:
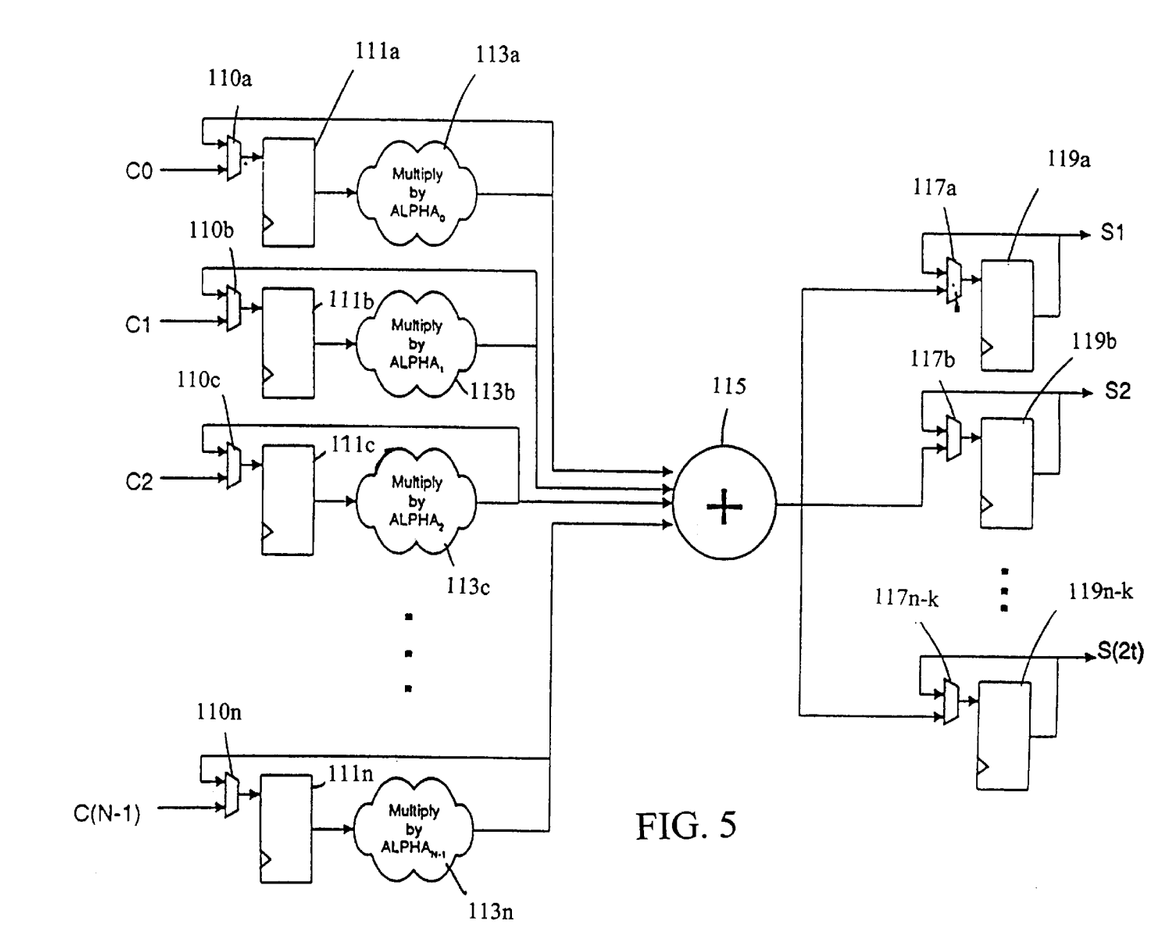
FIG. 5 illustrates a block diagram of a syndrome block of the decoder of FIG. 4.

FIG. 5 illustrates a syndrome generator of the present invention. The syndrome generator of the present invention calculates a single syndrome each clock cycle. Calculation of a syndrome requires the presence of all of the symbols making up a received word. Accordingly, all the symbols of a received words are provided to the syndrome block. As discussed in the embodiment described the code employed is an RS (255,241) code, with each symbol comprising one byte. Each of the symbols, $R_i$, is provided to a separate multiplexer 110a–n. The multiplexer's output is connected to a storage element 111a–n, which in turn has an output multiplied by $\alpha_i$ by a multiplier 113a–n. The output of the multiplier is provided to a summer 115, as well as looped back to the multiplexer. The multiplexer is set to select the received word on the first cycle of every set of syndrome generation, namely for the first syndrome word for each received word, and thereafter to select the looped back value.

Thus, and using the first received word as an example, in a first clock cycle the output of the multiplier is $R_0 \times (\alpha_0)$. On the next clock cycle the selector to the multiplexer is set to select the looped back element, and the output of the multiplier is $R_0 \times (\alpha_0)^2$. As each column of the matrix defining syndrome generation increases by a power of 2, appropriate selection of the multiplicands for the multipliers allows the output of the summer to correspond each cycle to a succeeding syndrome word. Thus, the architecture of FIG. 6 uses n multipliers which are time multiplexed to generate 2t syndrome words.

The output of the multipliers are intermediate terms $INT_0$–$INT_{N-1}$. The intermediate terms are summed at a summer to generate a syndrome word $S_i$. The syndrome word $S_i$ is provided to 2t multiplexers 117a–(n-k). The multiplexers provide their output to a corresponding register (119a(n-k), whose output is looped back as a second input to the multiplexer. Each multiplexer is set to select the syndrome word $S_i$ one out of 2t clock cycles. Thus, a first register is provided the first syndrome word $S_1$ on a first clock cycle, a second register is provided the second syndrome word $S_2$ on a second clock cycle, until all 2t syndrome words are present in the registers.

Returning now to FIG. 4, the syndrome words are provided to the key equation solver. The key equation solver executes the Berlekamp algorithm to form an error locator polynomial.

Figure 6:
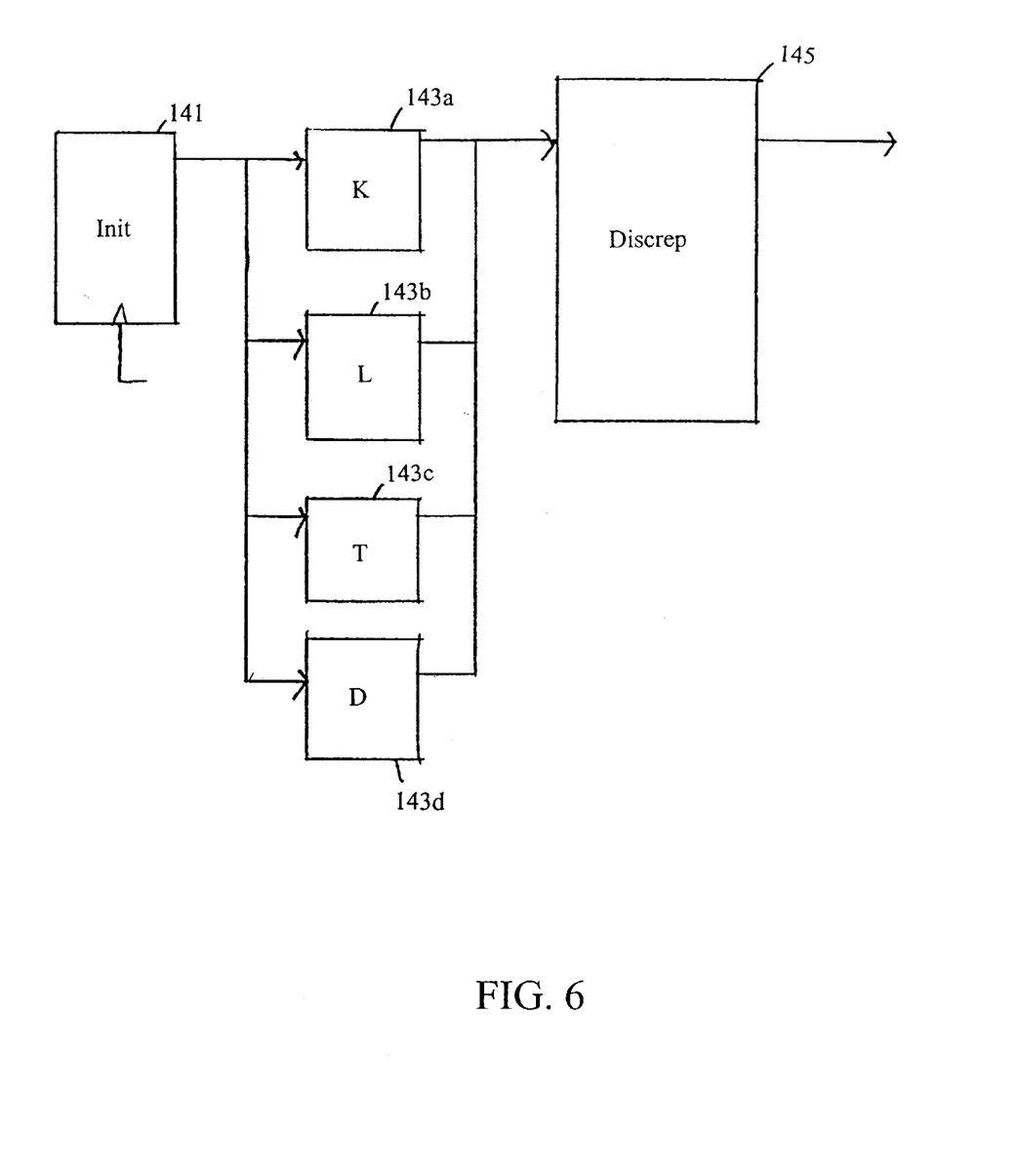
FIG. 6 illustrates a block diagram key equation unit of the decoder of FIG. 4.

A key equation solver in accordance with the present invention is shown in detail in FIG. 6. The key equation solver receives the entire syndrome word S(x) and generates an error locator polynomial. The key equation solver includes an initialization block to initialize internal variables used in the calculation of the error locator polynomial. The initialization block forms a reset signal to reset registers 143a–d of the key equation solver prior to calculation of the error locator polynomial. The key equation solver also includes a discrepancy computation block 145. The discrepancy computation block computes the discrepancy using the syndromes and the data in the registers. The discrepancy computation block also includes circuitry for modifying the discrepancy. For a code with 2t redundant symbols, i.e., 2t syndromes, the discrepancy is calculated 2t times.

The discrepancy computation block is therefore provided the syndrome and the discrepancy block registers are initialized during a first cycle. The discrepancy computation block also calculates a discrepancy during the first clock cycle using the syndrome and the valves in the registers. During a second clock cycle the discrepancy computation block calculates a further discrepancy using the circuitry which calculated the discrepancy during the first clock cycle. This process continues until all 2t operations are completed.

Returning once again to FIG. 4, the error locator polynomial is provided to the error location and error magnitude block. The error location and error magnitude block, in the described embodiment, implements a Chien search to locate the roots of the error locator polynomial, and uses Forney's algorithm to determine the error magnitudes. A Chien search is preferred by evaluating the error locator polynomial at all n locations. Thus, for an error locator polynomial $L(x)=a_1+a_2x+a_3x^2+a_4x^3+ \ldots +a_tx^t$ the polynomial $L(x)$ is evaluated for values of $x=\alpha, \alpha^2, \alpha^3, \ldots, \alpha^n$.

Figure 7:
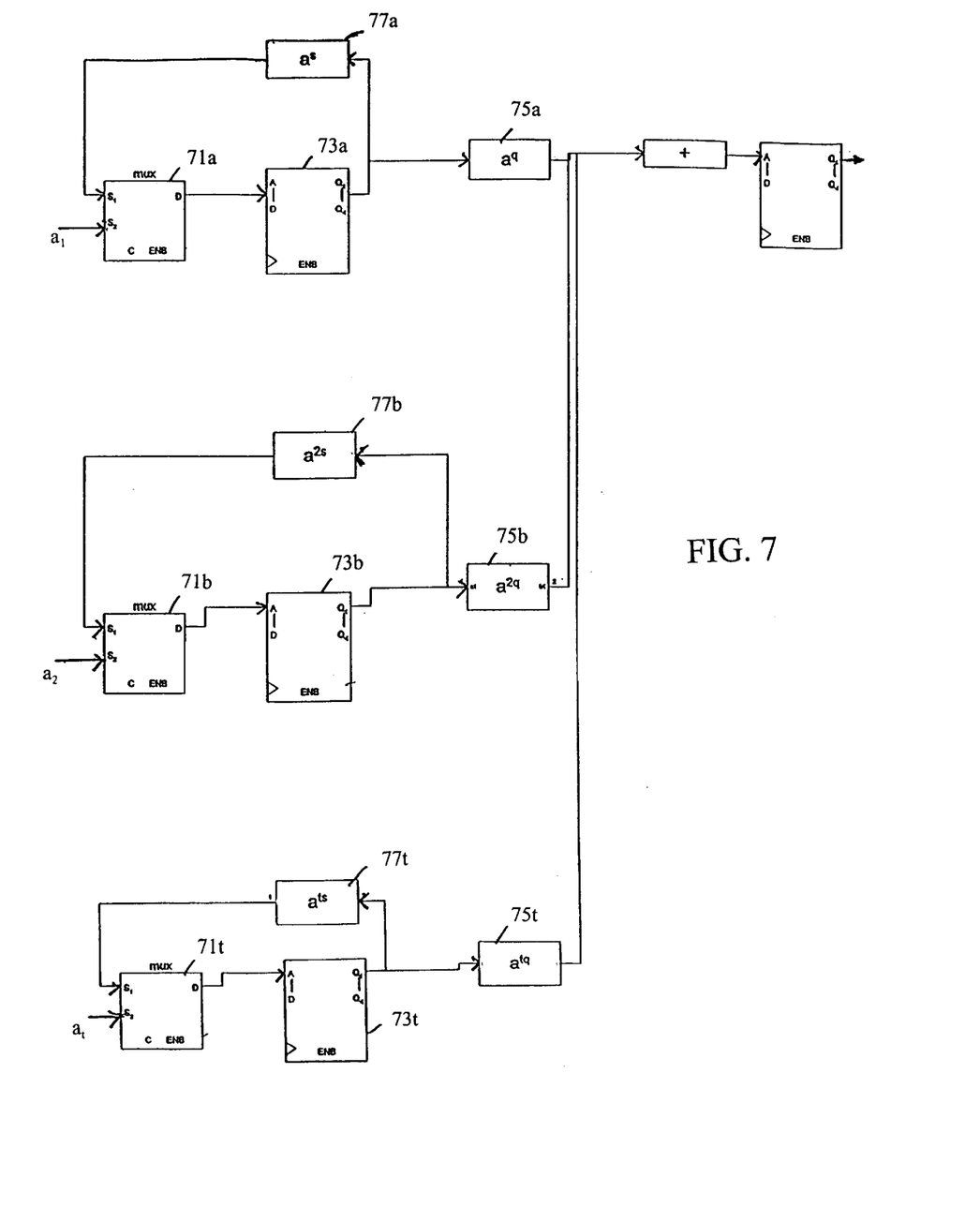
FIG. 7 illustrates a polynomial evaluation unit of the error location and error magnitude block.

The error location and error magnitude block utilizes S polynomial evaluators. Each of the S polynomial evaluators evaluates n/S roots of the error locator polynomial. FIG. 7 illustrates a block diagram of a single polynomial evaluator. The polynomial evaluator receives as inputs the coefficients $a_1, \ldots a_t$ of the error locator polynomial. Each of the coefficients is provided to a multiplexer 71a–t, which is set to select the coefficient on a first cycle. The output of the multiplexer is provided to a register 73a–t. The output of the register is, in turn provided to two multipliers 75a–t, 77a–t. A first multiplier 75a–t is coupled to a summer, which sums the elements of the polynomial. A second multiplier 77a–e has an output fed back to the multiplexer. The first multiplier multiples by $\alpha^{tq}$, where t is the order of the coefficient and q identifies one of the 1 through S polynomial evaluators. The second multiplier multiplies by $\alpha^{ts}$. As an example, if two polynomial evaluators are used, on a first cycle for the second coefficient the output of the multiplier is $a_3\alpha^2$ for a first polynomial evaluation block and $a_3\alpha^4$ for a second polynomial evaluation block. On a next cycle the same outputs are $a_3\alpha^8$ and $a_3\alpha^{16}$, respectively. Thus, each polynomial evaluation unit evaluates every S possible roots, and n/S cycles are used to evaluate all n possible roots.

Returning now to FIG. 4, the error location and error magnitude block provides an error vector to the error correction and error monitor block 51. The error correction and error monitor block thereafter forms an information vector using the error vector and the received data.

Accordingly, the present invention provides a forward error correction system and methods. Although this invention has been described in certain specific embodiments, many additional modifications and variations will be apparent to those skilled in the art. It is therefore to be understood that this invention may be practiced otherwise than as specifically described. Thus, the present embodiments of the invention should be considered in all respects as illustrative and not restrictive, the scope of the invention being indicated by the appended claims and their equivalents rather than the foregoing description.

What is claimed is:

1. A method of performing semi-parallel encoding and decoding of a data stream comprised of k-symbol information words using an (n,k) non-systematic code, the method comprising:

sequentially providing a plurality of sets of a plurality of information symbols to an encoder, each set of the sets of the plurality of information symbols being less than k symbols, each set of the sets of the plurality of information symbols being subsets of information symbols of a k-symbol information word;

sequentially performing Galois field multiplication on each set of the sets of a plurality of information symbols to form sets of codeword symbols of an n-symbol codeword;

sequentially generating n–k syndromes;

determining an error locator polynomial using the n–k syndromes; and evaluating a plurality of roots of the error locator polynomial using a plurality of polynomial evaluators, each polynomial evaluator evaluating a plurality of the roots of the error locator polynomial.

2. The method of claim 1 wherein sequentially generating n-k syndromes comprises:

multiplying each symbol of the n-symbol codeword by a Galois field element to form first syndrome intermediate terms and combining the first syndrome intermediate terms on a first syndrome calculation clock cycle; and multiplying each first syndrome intermediate term by a Galois field element to form second syndrome intermediate terms and combining the second syndrome intermediate terms on a second syndrome calculation clock cycle.

3. The method of claim 2 wherein evaluating a plurality of the roots of the error locator polynomial comprises:

providing the coefficients of the error locator polynomial to each of the plurality of polynomial evaluators, the plurality of polynomial evaluators including S polynomial evaluators;

in each polynomial evaluator, multiplying each coefficient by a Galois field element raised to the jQ power, where j indicates the power to which the polynomial element is raised for a specific coefficient and Q indicates a specific polynomial evaluator, with 1<Q<S, to form polynomial components;

in each polynomial evaluator, combining the polynomial components to determine a value for the polynomial;

in each polynomial evaluator, multiplying each coefficient by a Galois field element raised to the jS power, to form intermediate terms;

in each polynomial evaluator, multiplying each intermediate term by the Galois field element raised to the jQ power to form further polynomial components; and in each polynomial evaluator, combining the further polynomial components to determine a value for the polynomial.

4. A method of performing semi-parallel encoding of a data stream comprised of k-symbol information words using an (n,k) non-systematic code, the method comprising:

sequentially providing sets of a plurality of information symbols to an encoder, the sets of the plurality of information symbols together forming a k-symbol information word; and sequentially performing Galois field multiplication on each set of the plurality of information symbols to form sets of codeword symbols of an n-symbol codeword.

5. A method of performing semi-parallel decoding using an (n,k) code, the method comprising:

provising a codeword to a syndrome generator;

sequentially generating n–k syndromes by multiplying each symbol of the codeword by a Galois field element to form first syndrome intermediate terms and combining the first syndrome intermediate terms on a first clock cycle and multiplying each first syndrome intermediate term by a Galois field element to form second syndrome intermediate terms and combining the second syndrome intermediate terms on a second clock cycle;

determining an error locator polynomial using the n–k syndromes;

evaluating a plurality of roots of the error locator polynomial using a plurality of polynomial evaluators, each polynomial evaluator evaluating a plurality of the roots of the error locator polynomial.

\* \* \* \* \*

UNITED STATES PATENT AND TRADEMARK OFFICE
CERTIFICATE OF CORRECTION

PATENT NO. : 6,694,476 B1
DATED : February 17, 2004
INVENTOR(S) : Satish Sridharan et al.

It is certified that error appears in the above-identified patent and that said Letters Patent is hereby corrected as shown below:

Title page,
Item [56], References Cited, OTHER PUBLICATIONS, "Stephen Wicher" reference "paes" should be -- pages --; "Hayes Neifeld" reference "Haysem" should be -- Hayes --

Column 3,
Line 25, "$I_n$-$I_{n-21}$" should be -- $I_{n-7}$-$I_{n-21}$ --

Signed and Sealed this

Seventeenth Day of August, 2004

JON W. DUDAS
*Acting Director of the United States Patent and Trademark Office*